United States Patent [19]

Sanwo et al.

[11] Patent Number: 4,823,024
[45] Date of Patent: Apr. 18, 1989

[54] SIGNAL EDGE TRIMMER CIRCUIT

[75] Inventors: Ikuo J. Sanwo, San Marcos; James A. Donahue; Donald G. Tipon, both of San Diego, all of Calif.

[73] Assignee: NCR Corporation, Dayton, Ohio

[21] Appl. No.: 212,833

[22] Filed: Jun. 29, 1988

[51] Int. Cl.⁴ .................. H03K 5/00; H03K 17/56; H03K 3/01; H03K 17/687

[52] U.S. Cl. .................. 307/262; 307/246; 307/482; 307/270; 307/578; 307/597; 307/451

[58] Field of Search .............. 307/263, 265, 268, 270, 307/482, 246, 578, 594, 597, 450, 451, 262

[56] References Cited

U.S. PATENT DOCUMENTS

| | | | |
|---|---|---|---|
| 3,073,971 | 1/1963 | Daigle, Jr. | 307/88.5 |
| 3,073,972 | 1/1963 | Jenkins | 307/88.5 |
| 3,197,656 | 7/1965 | Kintner | 307/88.5 |
| 3,244,907 | 4/1966 | Daigle, Jr. | 307/88.5 |
| 3,480,796 | 11/1969 | Polkinghorn et al. | 307/578 |
| 3,508,083 | 4/1970 | Stern | 307/293 |
| 3,619,653 | 11/1971 | Poppinger et al. | 307/252 |
| 3,626,202 | 12/1971 | Pound | 307/208 |
| 3,769,528 | 10/1973 | Chu et al. | 307/578 |
| 3,937,983 | 2/1976 | Reed | 307/270 |
| 4,047,057 | 9/1977 | Ahmed | 307/273 |
| 4,061,933 | 12/1977 | Schroeder et al. | 307/246 |
| 4,071,783 | 1/1978 | Knepper | 307/246 |
| 4,484,092 | 11/1984 | Campell, Jr. | 307/246 |
| 4,550,264 | 10/1985 | Takahashi et al. | 307/578 |
| 4,574,203 | 3/1986 | Baba | 307/578 |
| 4,651,103 | 3/1987 | Grimes | 328/72 |
| 4,691,120 | 9/1987 | Kondo | 307/265 |

OTHER PUBLICATIONS

M. Annaratone, "Digital CMOS Circuit Design", 90 (1986).

Primary Examiner—Stanley D. Miller
Assistant Examiner—Trong Quang Phan
Attorney, Agent, or Firm—Wilbert Hawk, Jr.; Stephen F. Jewett

[57] ABSTRACT

A MOS circuit for trimming a digital pulse signal by delaying the rising edge of the pulse signal for a predetermined period of time and passing the falling edge without delay. The circuit includes two MOS output transistors and a signal buffer. The signal buffer has a number of stages for delaying the pulse signal, with the number chosen to control the delay in the rising edge of the pulse signal. One of the output transistors receives the pulse signal at its drain and is enabled by the delayed pulse signal from the signal buffer to pass the pulse signal after the predetermined period of time to its source at the output of the circuit, so that the rising edge is delayed, but the falling edge is not. The other output transistor is enabled to ground the output of the circuit after the falling edge of the pulse signal. A self-booting circuit drives the gate of the one output transistor to assure that the voltage level of the trimmed signal will not be reduced by dissipation across the transistor.

11 Claims, 3 Drawing Sheets

SIGNAL EDGE TRIMMER CIRCUIT

BACKGROUND OF THE INVENTION

The present invention relates to data processing systems and, more particularly, to a circuit in such systems for trimming a digital pulse signal.

The circuits in a computer system require the use of many timing, clocking and other digital pulse signals. In a typical system, a portion of the hardware is devoted exclusively to the generation of such signals. Typically, a few basic pulse signals are generated, and the other signals needed by the system are provided by adjusting or processing those basic signals. One pulse signal often needed has the rising edges of its pulses only slightly delayed from the pulses in the basic signal from which it is obtained. A pulse signal which has its rising edges delayed from, but its falling edges coincident with, the corresponding edges of a more basic pulse signal is referred to as a "trimmed" signal.

Circuits for trimming digital pulse signals are known in the art. For example, in U.S. Pat. No. 3,073,971, issued to E. J. Daigle, Jr. on January 15, 1963, there is shown a circuit having an RC integrator and NPN and PNP transistors, including two NPN transistors that form a differential amplifier. The differential amplifier causes the rising edge of an input pulse to be delayed according to the time constant of the RC integrator, but passes the falling edge without delay.

The problem with circuits such as the one disclosed in the Daigle patent is that they are not suited for modern computer circuitry. For example, in a computer having integrated circuit chips fabricated using MOS technology, it would be difficult to include an RC circuit for controlling the signal delay as done in the Daigle patent and, even if done, it would not control the delay with the precision needed for the extremely fast operation of today's integrated circuits. This is readily apparent from a reading of the Daigle patent, which refers to a delay in the rising edge of "10 milliseconds", and then considering the need, in a typical modern computer, for a delay of perhaps 10 nanoseconds.

SUMMARY OF THE INVENTION

There is provided, in accordance with the present invention, a signal edge trimmer circuit in a MOS device, the circuit receiving a pulse signal which has a first transition from a first signal level to a second signal, and a second transition from the second signal level back to the first signal level. The circuit delays for a predetermined period of time the first transition, which in the described embodiment is a rising edge from a "0" logic level to a "1" logic level, and passes without delay the second transition, which in the described embodiment is a falling edge from a "1" back to a "0". The circuit includes MOS signal buffer means at its input for receiving and delaying the pulse signal, and a MOS output transistor at the output of the circuit for providing the trimmed signal. The output transistor receives the pulse signal at its drain and passes the pulse signal to its source as the trimmed signal in response to an enabling signal at its gate. MOS control means receives the delayed signal from the signal buffer means and provides the delayed signal to the gate of the output transistor as the enabling signal. As a result, the output transistor is enabled to pass the rising edge of the pulse signal the predetermined period of time after it is received by the output transistor and, further, the output transistor continues to be enabled by the enabling signal at its gate when the falling edge of the pulse signal is received at the output transistor.

In the described embodiment, the MOS signal buffer means inverts the delayed pulse signal and includes several stages of MOS transistors, with the number of stages chosen in order to determine the delay in the rising edge of the trimmed pulse. Further, a second MOS output transistor is provided at the output of the circuit and has its gate connected for receiving the delayed signal from the signal buffer means. The second output transistor is enabled by the delayed signal to ground the output of the trimmer circuit so that the trimmed signal continues to be at a "0" logic level after the first mentioned output transistor ceases to be enabled.

The MOS control means includes MOS transistors for passing the delayed pulse signal from the signal buffer means, one of the MOS transistors having its drain and source tied in order to act as a capacitor, with the gate of that transistor rising to a voltage level greater than the nominal voltage level of a "1" logic level, and with such greater voltage level used to enable the output transistor so that there is reduced signal dissipation in the trimmed signal at the output of the trimmer circuit.

It is therefore an object of the present invention to provide a new and improved signal edge trimmer circuit for use in a MOS device.

It is another object of the present invention to provide such a circuit which permits precise control of the amount of delay in the rising edge of a pulse signal.

It is yet another object of the present invention to provide such a circuit where the trimmed signal at its output has a signal level that is not reduced because of signal dissipation in the transistor elements of the circuit.

It is still a further object of the present invention to provide a signal edge trimmer circuit that can be readily integrated onto a MOS device with few MOS transistors and minimal cost.

These and other objects, features and advantages of the present invention will become apparent from the following description and the attached drawings.

DETAILED DESCRIPTION OF THE PREFERRED EMBODIMENT

Figure 1:
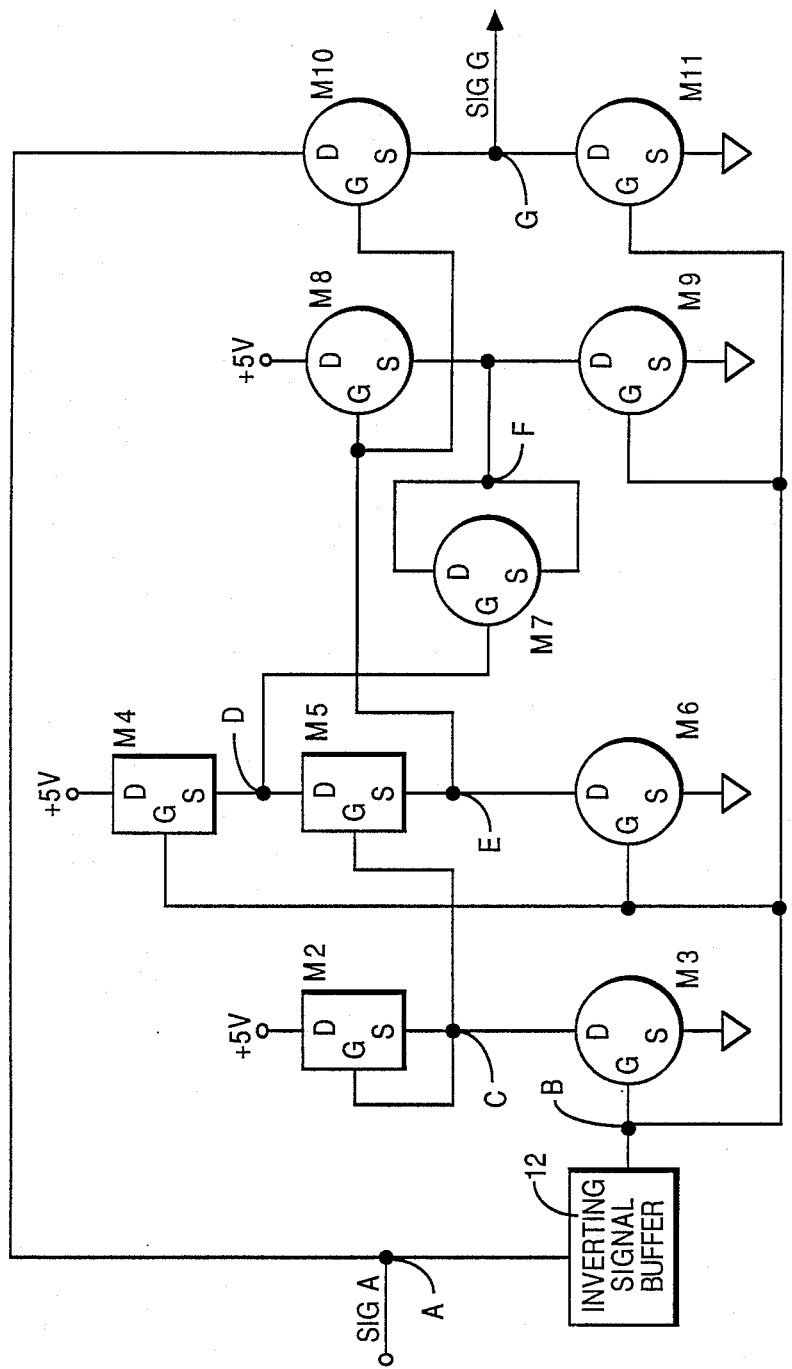
FIG. 1 is a circuit diagram of a signal edge trimmer circuit in accordance with the present invention.

Referring now to FIG. 1, there is seen a signal edge trimmer circuit 10 in accordance with the present invention. The circuit 10 consists of an inverting signal buffer circuit 12 (to be described in greater detail later in connection with FIG. 3), a control circuit consisting of transistors M2, M3, M4, M5, M6, M7, M8 and M9, and two output transistors M10 and M11. The buffer circuit 12 and the transistors M2 through M11 are all nMOS devices, with transistors shown conventionally as having three terminals (a gate "G", a drain "D" and a source "S"). Also, the transistors are conventionally shown as either depletion-type (e.g., M2) depicted by a square-shaped symbol, or enhancement-type (e.g., M3) depicted by a circular-shaped symbol. It is contemplated that the trimmer circuit 10 would form part of a larger MOS integrated circuit, such as one having a microprocessor that would use the trimmed pulse signal appearing at the output of the trimmer circuit 10.

The buffer circuit 12 receives a digital pulse signal SIG A at the input of the trimmer circuit 10 and delays the digital pulse signal. The output of the buffer circuit 12 is connected to the gates of transistors M3, M4, M6, M9, and M11. The source terminals of the transistors M3, M6, M9 and M11 are connected to a reference or ground signal and the drain terminals of M2, M4 and M8 are connected to a +5 V power signal. The gate and source of M2 are tied together and connected to the drain of M3 and the gate of M5. The source of M4 is connected to the drain of M5 and the gate of M7. The source of M5 is connected to the drain of M6 and the gates of M8 and M10.

The drain and source of M7 are tied together, as well as to the source of M8 and the drain of M9. As will be more fully described later in conjunction with the operation of the trimmer circuit 10, the transistor M7 acts as a capacitor because of its drain and source being tied together, and this gate capacitance between the gate and the drain and source results in a higher voltage at the gate of output transistor M10. The higher voltage at the gate of M10 provides a self-booting feature to the trimmer circuit 10, causing the high or "1" logic level of the trimmed pulses of the output signal SIG G to be at the full nominal voltage level (+5 V), rather than a reduced voltage level because of dissipation across the channel connecting the drain and source within M10.

The drain of M10 is connected for receiving the signal SIG A from the input of the trimmer circuit 10 and is enabled to pass the signal SIG A as the trimmed output signal SIG G in response to an appropriate enabling signal at the gate of M10. The source of M10 is connected to the drain of M11.

The operation of the trimmer circuit 10 will now be described in connection with FIGS. 1 and 2. By way of explanation, the letter associated with each signal waveform shown in FIG. 2 corresponds to the node in the circuit 10 in FIG. 1 where such signal appears. For example, signal SIG A corresponds to the input signal appearing at node A in FIG. 1, signal SIG B corresponds to the signal appearing at node B, and so forth.

When the input signal SIG A is initially at a "0" logic level (0 V), SIG B at the output of the inverting signal buffer circuit 12 is at a "1" logic level, having a voltage of approximately +4 V (rather than +5 V) because of dissipation resulting from its propagation through the buffer circuit 12. M11 is enabled or turned on because of the "1" appearing at its gate, resulting in node G being grounded through M11 and in output signal SIG G being at a "0" logic level. At the same time, M3, M4, M6 and M9 are also turned on, resulting in the signals SIG C, SIG E and SIG F all being at "0". The signal SIG D is at +4 V, since M7 acts as a capacitor with its drain and source tied together to ground through M9 and its gate influenced by the +5 V power signal at the drain of enabled M4. Transistors M2, M5, M8 and M10 are all disabled or turned off.

When the input signal SIG A goes to a "1" logic level, the output of the buffer circuit 12 goes to "0" (after a period of time determined by the propagation delay through buffer circuit 12), disabling M3, M4, M6, M9 and M11. The continuing drain-to-source current flow through M2 charges node C, causing M2 to turn itself on and the rising voltage at its tied gate and source to reach +5 V. The "1" on node C causes M5 to turn on, which in turn causes the capacitive charge at M7 to discharge through M5 and the voltage level of SIG E to rise and turn on M8 and M10.

With M8 enabled, node F is now connected to the +4 V power signal through M8 and the signal SIG F rises to approximately +4 V. Because M7 acts as a charged capacitor, the voltage at node D also rises to maintain the potential difference across the capacitor, and reaches approximately +8 V. The voltage at node E then rises with the voltage at node D (since M5 is enabled), with SIG E reaching a higher than nominal value of +6 V in order to enable M10. The "1" level of the input signal SIG A at the drain of M10 is thus passed by M10 to the output as SIG G, with the voltage level being at a full +5 V because of the higher voltage (+6 V) appearing at the gate of M10.

The self-booting feature just described, namely, obtaining a full signal level for SIG G by connecting M7 as a capacitor and permitting nodes D and E to rise to a voltage level higher than the nominal voltage level (+5 V) of the power signals provided to the circuit 10, is quite advantageous in a MOS circuit, since it permits the output signal SIG G to be passed by M10 without the signal dissipation normally accompanying the passage of a signal through the drain-to-source channel of a MOS transistor.

Figure 2:
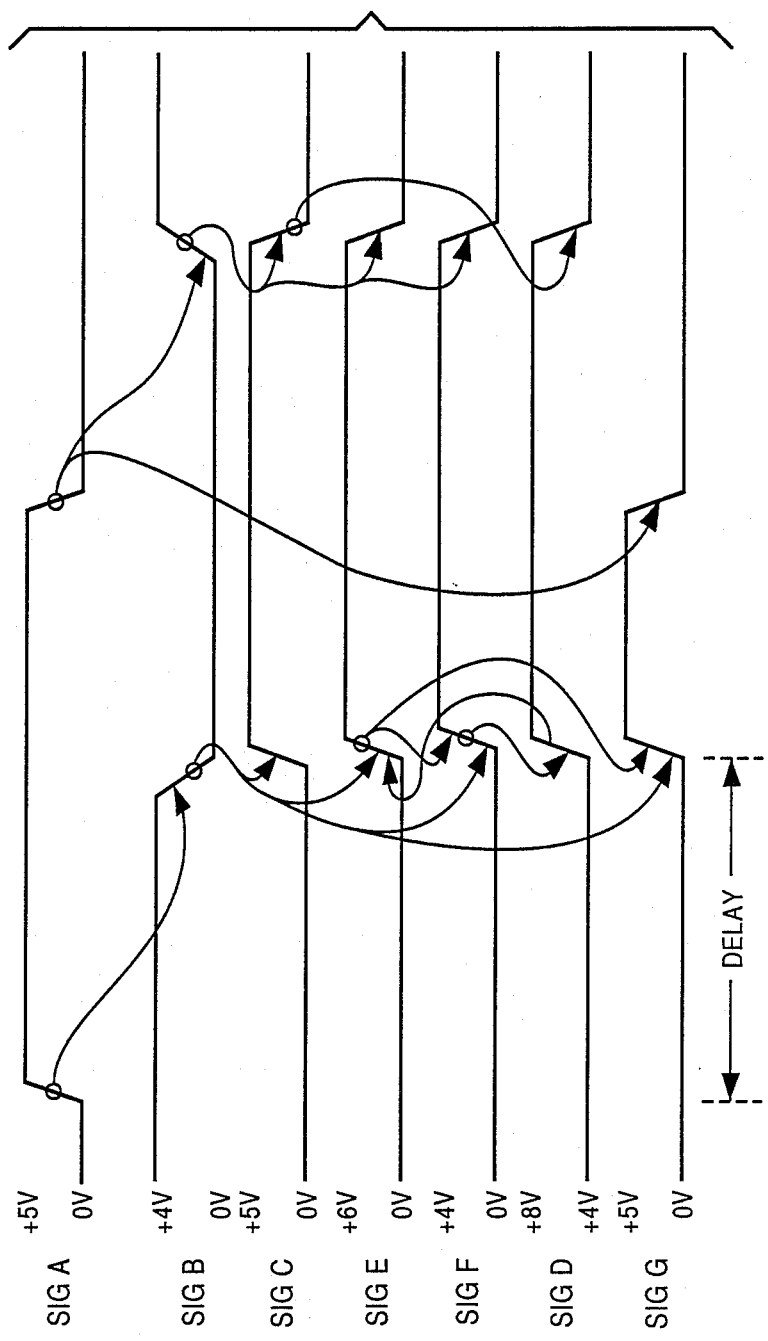
FIG. 2 is a waveform diagram of signals appearing in the circuit of FIG. 1 during the operation thereof.

The amount by which the rising edge of the input pulse SIG A is delayed when passed as the output signal SIG G is illustrated in FIG. 2 and is determined by the combination of the delay in the passage of the input signal SIG A through the inverting signal buffer circuit 12, and the delay in the signals propagating through the transistors M2, M5, M7, and M8 in order to enable M10, including the time taken for the voltage at node C to rise in order to turn on M2 and for the voltage at node E to rise from the discharge of M7 in order to turn on M10.

When the falling edge appears in the input signal SIG A, the output signal SIG G immediately falls as seen in FIG. 2. Transistor M10, which is still enabled by SIG E, passes the falling edge of SIG A as soon as it appears at the drain of M10. After the delay resulting from the propagation through the buffer circuit 12, SIG B goes to a "1", causing M3, M4, M6, M9 and M11 to be enabled. Node G becomes grounded through M11, thus making SIG G stay at "0". M2, M5, M8 and M10 all turn off, and SIG D drops to 4 V, representing the potential difference that then develops across the capacitor formed by M7.

Figure 3:
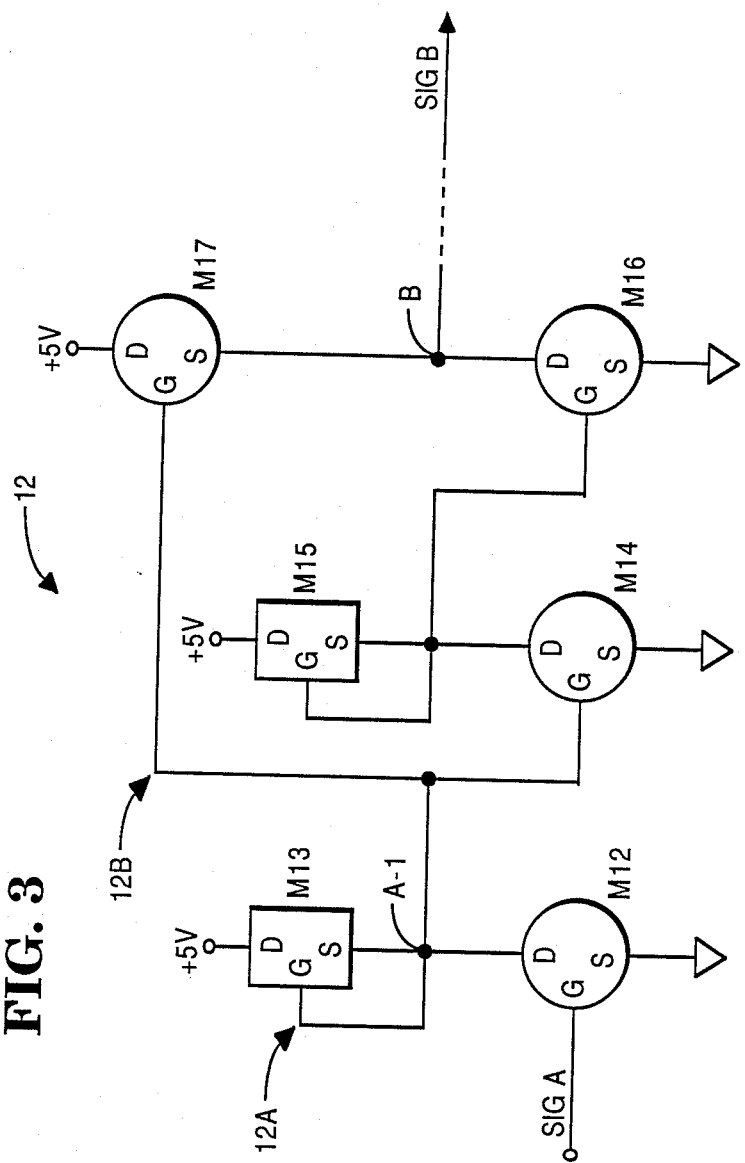
FIG. 3 is a circuit diagram of the inverting signal buffer in the circuit of FIG. 1.

FIG. 3 shows in greater detail the inverting signal buffer circuit 12. Buffer circuit 12 includes an inverting buffer 12A and a non-inverting buffer 12B. Inverting buffer 12A includes transistors M12 and M13, with the gate of M12 connected for receiving the input signal SIG A and with the source of M12 connected to ground. The drain of M12 is connected by way of a node A-1 to the gate and source of M13. The drain of M13 is connected to the +5 V power signal.

When SIG A is at a "0", M12 is disabled and the voltage at the node A-1 rises and causes M13 to turn on. The node A-1, which represents the output of inverting buffer 12A, thus goes to a "1". When SIG A is at a "1", node A-1 is grounded by M12, and thus goes to a "0".

Non-inverting buffer 12B includes transistors M14, M15, M16, and M17. M14 and M15 operate in the same way as M12 and M13, respectively, of inverting buffer 12A. When M14 is disabled by a "0" appearing at the node A-1, M15 turns on. M16 is enabled and thus grounds node B and causes the output signal SIG B to go to "0". When M14 is enabled by a "1" appearing at the node A-1, the gate of M16 is grounded and M16 turns off. M-17 is enabled and connects the +5 V power signal at the drain of M17 to node B. The output signal SIG B thus goes to a "1".

While not shown in FIG. 3, additional stages, each comprised of buffers 12A and 12B, could be added to the buffer circuit 12 in order to increase the amount of delay in the signal SIG B and the delay in the rising edge of the trimmed output signal SIG G (FIGS. 1 and 2). In an actual embodiment of the signal edge trimmer circuit 10, a delay of 11 nanoseconds was needed and four stages were used in the signal buffer circuit 12. This gave a propagation delay of 6 nanoseconds in the buffer circuit 12, with the remaining 5 nanoseconds of delay coming from the propagation through the other transistors in the trimmer circuit 10.

It can thus be seen that there has been provided by the present invention a signal edge trimmer for incorporation into a MOS integrated circuit, permitting precise control of the delay in the trimmed signal with minimal circuit elements.

Although the presently preferred embodiment of the invention has been described, it will be understood that various changes may be made within the scope of the appended claims.

What is claimed is:

1. In a MOS device, a signal edge trimmer circuit for trimming a digital pulse signal having a first transition from a first signal level to a second signal level and a second transition from the second signal level back to the first signal level, wherein said circuit delays the first transition for a predetermined period of time and passes the second transition without delay, said circuit comprising:
    MOS signal buffer means at the input of said circuit for delaying the pulse signal;
    MOS output transistor means at the output of said circuit for providing the trimmed pulse signal, said MOS output transistor means connected for receiving the pulse signal and for passing the pulse signal in response to an enabling signal; and
    MOS control means for receiving the delayed signal from said MOS signal bufffer means and providing the delayed signal to said MOS output transistor means as the enabling signal, so that said MOS output transistor means is enabled by the enabling signal to pass the pulse signal the predetermined period of time after the first transition of the pulse signal has been received by said MOS output transistor means, and so that said MOS output transistor means continues to be enabled by the enabling signal when the second transition of the pulse signal is received by said MOS output transistor means in order to pass the second transition without delay.

2. The signal edge trimmer circuit of claim 1, wherein said MOS output transistor means comprises:
    a first MOS output transistor connected for receiving and passing the pulse signal as the trimmed pulse signal in response to the enabling signal from said MOS control means; and
    a second MOS output transistor connected to said first MOS output transistor and for receiving and passing a reference signal as the trimmed signal in response to a second enabling signal;
    said MOS signal buffer means connected for providing the delayed signal to said second MOS output transistor as the second enabling signal so that the trimmed pulse signal remains at the first signal level after the second transition of the pulse signal is passed by said first MOS output transistor.

3. The signal edge trimmer circuit of claim 2, wherein the reference signal received by said second MOS output transistor is at the same voltage level as the first signal level.

4. The signal edge trimmer circuit of claim 3, wherein said first MOS output transistor has a drain terminal connected for receiving the pulse signal to be passed by said first MOS output transistor, a source terminal connected for providing the trimmed pulse signal to the output of said circuit, and a gate terminal connected for receiving the enabling signal.

5. The signal edge trimmer circuit of claim 4, wherein said second MOS output transistor has a source terminal connected for receiving the reference signal, a drain terminal connected for providing the trimmed pulse signal to the output of said circuit, and a gate terminal connected for receiving the second enabling signal.

6. The signal edge trimmer circuit of claim 5, wherein said MOS control means self-boots said first MOS output transistor by providing the enabling signal to said first MOS output transistor at a voltage level greater than the second signal level of the pulse signal, said MOS control means comprising:
    third, fourth, and fifth MOS transistors, each having source, drain and gate terminals;
    the drain and source terminals of said third MOS transistor tied together and connected to the drain terminal of said fourth MOS transistor and to the source terminal of said fifth MOS transistor;
    the source terminal of said fourth MOS transistor connected for receiving the reference signal, and the gate terminal of said fourth MOS transistor connected for receiving the delayed signal from said MOS signal buffer means;
    the drain terminal of said fifth MOS transistor connected to a power signal having a voltage level at the second signal level, and the gate terminal of said fifth MOS transistor connected for receiving a charge stored in said third MOS transistor in order to enable said fifth MOS transistor after said fourth MOS transistor is disabled;
    said third MOS transistor acting as a capacitor, with the voltage at the gate of said third MOS transistor going to the voltage level greater than the second signal level when said fourth MOS transistor is disabled and said fifth MOS transistor is enabled.

7. The signal edge trimmer circuit of claim 6, wherein said MOS control means further comprises:
    sixth and a seventh MOS transistors;
    the gate terminal of said sixth MOS transistor connected for enabling said sixth MOS transistor after the first transition of the delayed pulse signal from said MOS signal buffer means, the drain terminal of said sixth MOS transistor connected to the gate terminal of said third transistor, and the source terminal of said sixth MOS transistor connected to the gate terminal of said first output transistor; and
    the gate terminal of said seventh MOS transistor connected for receiving the delayed signal from said MOS signal buffer means, the drain terminal of said seventh MOS transistor connected for receiving the power signal, and the source terminal of said seventh MOS transistor connected to the gate of said third MOS transistor;

so that the gate terminal of said third MOS transistor is connected to the gate terminal of said first MOS output transistor by said sixth MOS transistor when the gate terminal of said third MOS transistor goes to the voltage level greater than the second signal level.

8. The signal edge trimmer circuit of claim 7, wherein said MOS control means further comprises:

a eighth MOS transistor having a gate and source terminal tied together and connected to the gate terminal of said sixth MOS transistor; and a ninth MOS transistor having a drain terminal connected to the gate and source terminals of said eighth MOS transistor, a source terminal connected for receiving the reference signal, and a gate terminal for receiving the delayed signal from said MOS signal buffer means.

9. The signal edge trimmer circuit of claim 8, wherein said MOS control means further comprises a tenth MOS transistor having a drain terminal connected to the gate terminal of said first output transistor, a source terminal connected to the reference signal, and a gate terminal connected for receiving the delayed signal from said MOS signal buffer means, so that said fifth MOS transistor is disabled by said tenth MOS transistor after the second transition of the delayed pulse signal from said MOS signal buffer means.

10. A signal edge trimmer circuit for a MOS device, said circuit receiving a digital pulse signal having a leading edge and a trailing edge and providing a trimmed signal having a leading edge delayed a predetermined period of time with respect to the leading edge of the digital pulse signal ad having a trailing edge coincident with the trailing edge of the digital pulse signal, said circuit comprising:

MOS signal buffer means at the input of the said circuit for receiving and delaying the digital pulse signal;

a first MOS transistor at the output of said circuit, said first transistor connected for receiving the digital pulse signal and for passing the digital pulse signal as the trimmed signal in response , to a first enabling signal;

a second MOS transistor connected to said first MOS transistor at the output of said circuit, said second transistor connected for receiving a reference signal having the same voltage level as the digital pulse signal after the trailing edge and for passing the reference signal as the trimmed signal in response to a second enabling signal; and MOS control means for receiving the delayed signal from said signal buffer means and providing the delayed signal to said first transistor as the first enabling signal, so that said first transistor is enabled by the first enabling signal to pass the digital pulse signal the predetermined period of time after the digital pulse signal is received by said first transistor with the leading edge thereby delayed but the trailing edge not delayed;

said second transistor receiving the delayed signal from the signal buffer means as the second enabling signal, so that the trimmed signal remains at the same signal level when the delayed signal at the output of said MOS control means changes its signal level.

11. The signal edge trimmer circuit of claim 10, wherein said MOS control means includes a third MOS transistor having gate, source, and drain terminals, wherein the drain and source terminals of said third transistor are tied to each other and to a reference signal source by a fourth MOS transistor and to a power signal source by a fifth MOS transistor, said fourth transistor enabled when the delayed pulse signal from said MOS signal buffer means passes the trailing edge of the pulse signal received by said circuit, and said fifth transistor enabled when the delayed pulse signal from said MOS signal buffer means passes the leading edge of the pulse signal received by said circuit.

* * * * *